(12) United States Patent  
Lee, Jr.

(10) Patent No.: US 7,936,163 B2
(45) Date of Patent: May 3, 2011

(54) METHOD AND SYSTEM FOR DETECTING ELECTRICITY THEFT

(75) Inventor: Robert Edward Lee, Jr., Dover, NH (US)

(73) Assignee: General Electric Company, Schenectady, NY (US)

( * ) Notice: Subject to any disclaimer, the term of this patent is extended or adjusted under 35 U.S.C. 154(b) by 236 days.

(21) Appl. No.: 12/143,239

(22) Filed: Jun. 20, 2008

(65) Prior Publication Data

US 2009/0315535 A1    Dec. 24, 2009

(51) Int. Cl.
*G01R 1/00*    (2006.01)
(52) U.S. Cl. ....................................................... 324/110
(58) Field of Classification Search .................. None
See application file for complete search history.

(56) References Cited

U.S. PATENT DOCUMENTS

| | | | |
|---|---|---|---|
| 4,240,030 A | 12/1980 | Bateman et al. | |
| 4,386,313 A | 5/1983 | Venaas et al. | |
| 4,386,314 A | 5/1983 | Becker | |
| 4,532,471 A * | 7/1985 | Hurley | 324/110 |
| 4,583,043 A | 4/1986 | Phillips | |
| 4,749,938 A | 6/1988 | Bishop | |
| 4,833,455 A | 5/1989 | Bishop | |
| 5,184,119 A | 2/1993 | Stanbury et al. | |
| 5,227,668 A * | 7/1993 | Mutch et al. | 324/110 |
| 5,473,322 A * | 12/1995 | Carney | 324/110 |
| 5,621,397 A * | 4/1997 | Mutch et al. | 342/110 |
| 5,940,009 A * | 8/1999 | Loy et al. | 324/110 |
| 6,232,886 B1 | 5/2001 | Morand | |
| 6,236,197 B1 | 5/2001 | Holdsclaw et al. | |
| 7,106,044 B1 | 9/2006 | Lee, Jr. et al. | |
| 7,211,749 B2 | 5/2007 | Jenkins | |
| 7,317,404 B2 | 1/2008 | Cumeralto et al. | |
| 7,432,823 B2 * | 10/2008 | Soni | 324/110 |
| 7,638,998 B2 * | 12/2009 | Sanderford et al. | 324/110 |
| 2002/0074990 A1 * | 6/2002 | Shincovich | 324/110 |
| 2008/0109387 A1 * | 5/2008 | Deaver et al. | 702/62 |
| 2009/0146641 A1 * | 6/2009 | Sanderford et al. | 324/110 |
| 2010/0007336 A1 * | 1/2010 | de Buda | 324/127 |

* cited by examiner

*Primary Examiner* — Jermele M Hollington
(74) *Attorney, Agent, or Firm* — Armstrong Teasdale LLP

(57) ABSTRACT

A method for detecting electricity theft in an electricity meter is provided. The method includes determining a first power outage at the meter and determining whether load energy is flowing through the meter after power has been restored to the meter after the first power outage. The method also includes determining a second power outage at the meter, wherein the second power outage occurs after the first power outage, and determining whether load energy is flowing through the meter after power has been restored to the meter after the second power outage. The method also includes outputting an indication of a potential electricity theft based on the determinations of whether no load energy was flowing through the meter after the first power outage and whether load energy was flowing through the meter after the second power outage.

20 Claims, 4 Drawing Sheets

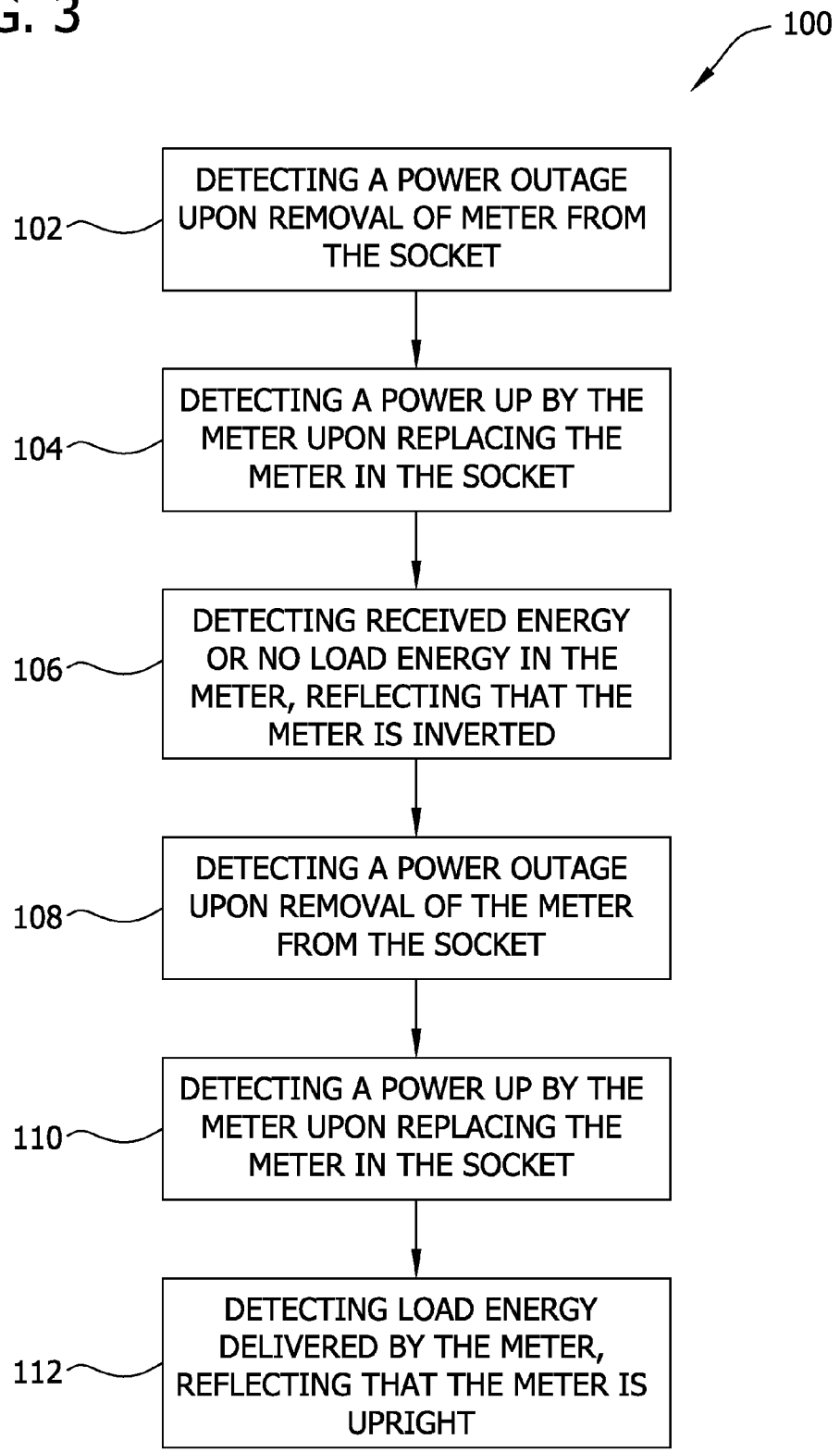

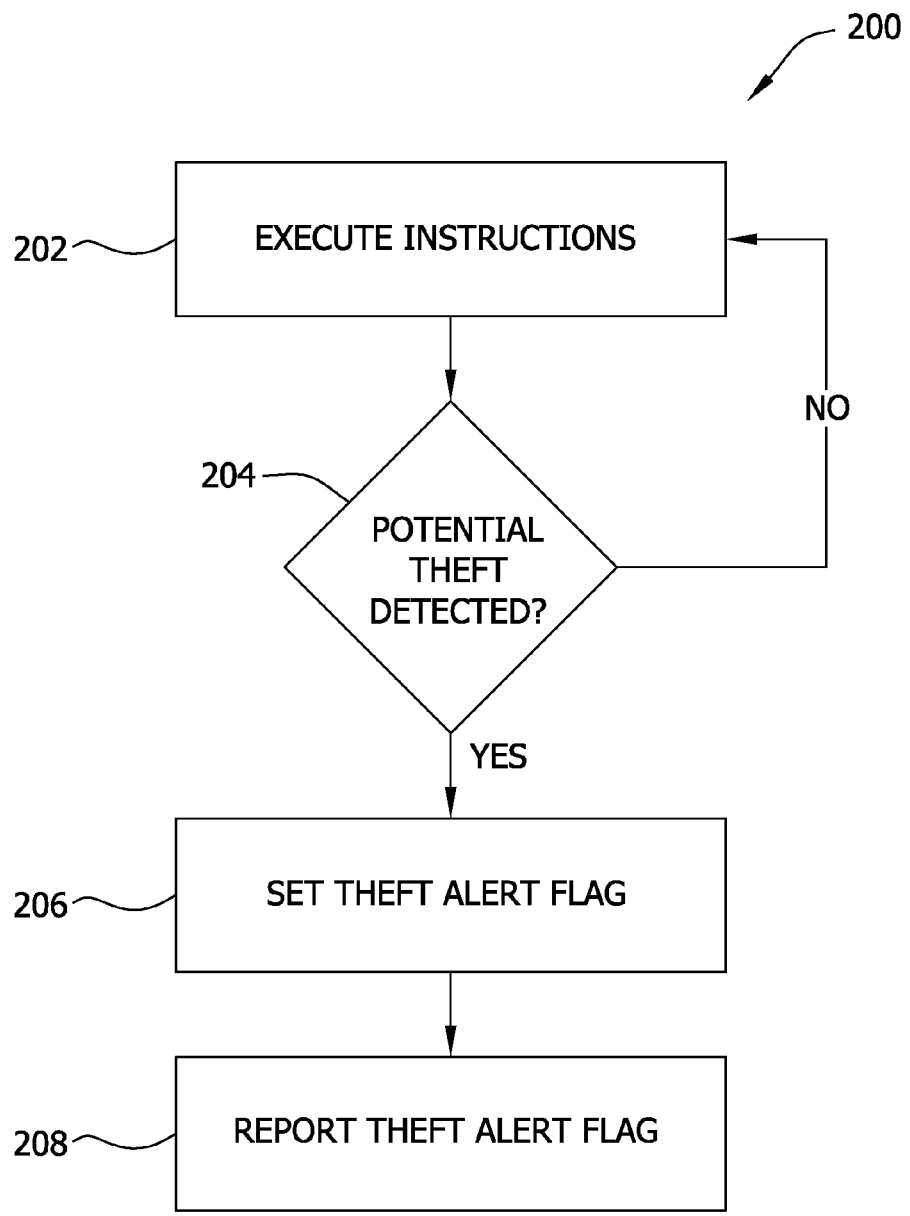

METHOD AND SYSTEM FOR DETECTING ELECTRICITY THEFT

BACKGROUND OF THE INVENTION

The field of this disclosure relates generally to electricity theft, and more particularly to the detection of electricity theft.

For many years, electric utility companies have discovered consumers that have attempted to steal power from the utility company. Moreover, as fuel and heating costs have risen, the number of consumers attempting to steal power has also risen. When inverted in a meter socket, at least some known electro-mechanical electricity meters may be incapable of detecting a flow of energy therethrough. For example, electricity meters that include 2-wire, one phase residential service meters that use a Form 1S are symmetrical and, after being inverted, generally cannot detect a flow of energy therethrough. Other known electricity meters that include 3-wire, two phase residential service meters that use a Form 2S generally detect a flow of received energy therethrough after being inverted. Some electricity customers have tampered with electricity meters by inverting the meters in their meter sockets in an attempt to reduce an accumulated energy reading on the meters, thereby reducing electricity bills associated with those meters.

Because residential electricity theft is a significant loss of revenue for electric utility companies, many electric utility companies would benefit from a timely alert that a potential electricity theft has been detected.

BRIEF DESCRIPTION OF THE INVENTION

In one aspect, a method for detecting electricity theft in an electricity meter is provided. The method includes determining a first power outage at the meter and determining whether load energy is flowing through the meter after power has been restored to the meter after the first power outage. The method also includes determining a second power outage at the meter, wherein the second power outage occurs after the first power outage, and determining whether load energy is flowing through the meter after power has been restored to the meter after the second power outage. The method also includes outputting an indication of a potential electricity theft based on the determinations of whether no load energy was flowing through the meter after the first power outage and whether load energy was flowing through the meter after the second power outage.

In another aspect, an electricity meter is provided. The electricity meter includes at least one sensing device for detecting at least one of a power outage at the meter and a flow of load energy through the meter. The electricity meter also includes a controller coupled to the at least one sensing device and configured to determine if no load energy flows through the meter after a first power outage at the meter, determine if load energy flows through the meter after a second power outage that occurs after the first power outage, and output an indication of a potential electricity theft based on the determinations of whether no load energy was flowing through the meter after the first power outage and whether load energy was flowing through the meter after the second power outage.

In another aspect, a system for detecting electricity theft is provided. The system includes a plurality of customer lines for transferring electricity from a utility company and at least one electricity meter coupled to each of the customer lines. The at least one electricity meter includes at least one sensing device for detecting at least one of a flow of load energy through the meter and a power outage at the meter. The at least one electricity meter also includes a controller coupled to the at least one sensing device. The controller includes executable instructions for determining if no load energy flows through the meter after a first power outage at the meter, determining if load energy flows through the meter after a second power outage at the meter that occurs after the first power outage, and outputting an indication of a potential electricity theft based on the determinations of whether no load energy was flowing through the meter after the first power outage and whether load energy was flowing through the meter after the second power outage.

BRIEF DESCRIPTION OF THE DRAWINGS

FIG. 3 is a flow diagram of an exemplary operational scheme of the electricity meter shown in FIG. 2; and FIG. 4 is a flow chart of an exemplary operation for use in detecting and reporting the operational scheme shown in FIG. 3.

DETAILED DESCRIPTION OF THE INVENTION

Figure 1:
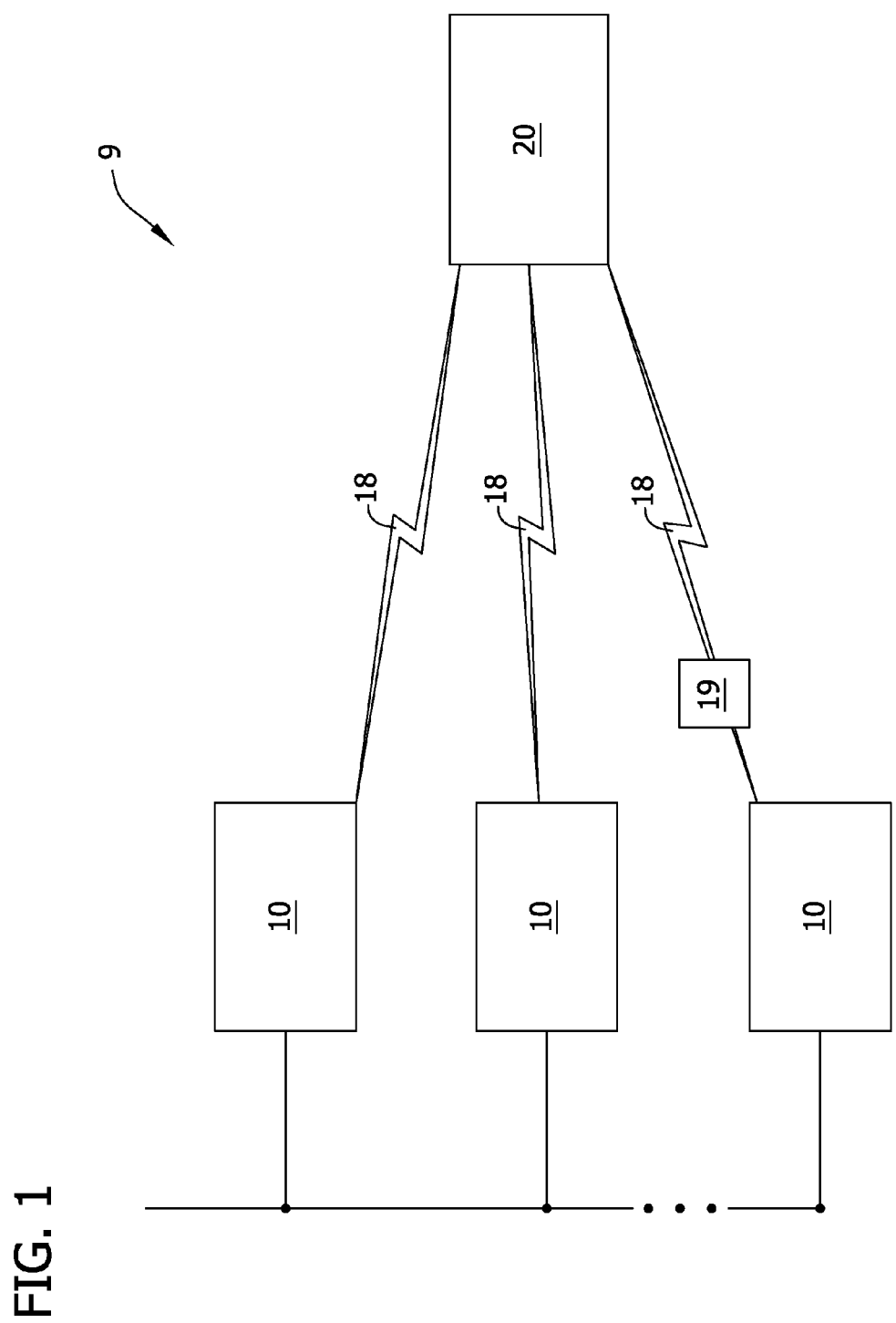
FIG. 1 is a schematic view of an exemplary system for use in detecting electricity theft.

FIG. 1 is a schematic view of an exemplary system 9 for detecting electricity theft. In the exemplary embodiment, system 9 includes a plurality of electricity meters 10 connected to a utility company 20 via a plurality of customer lines 18. In one embodiment, meters 10 monitor and track electricity usage and/or demand information for each energy customer associated with a respective customer line 18. Utility company 20 may interact with meters 10 to request and/or access information from meters 10 using a variety of methods, including, but not limited to, wired and/or wireless methods, such as via a telephone line, an automatic meter reading system 19, an optical port, an RS-232 line, a wireless system, and/or various other modes of communication. Additionally, receiving devices, such as phones, PDAs, notebook computers, specialized receivers, and/or other handheld devices, may be used to communicate with meters 10.

Figure 2:
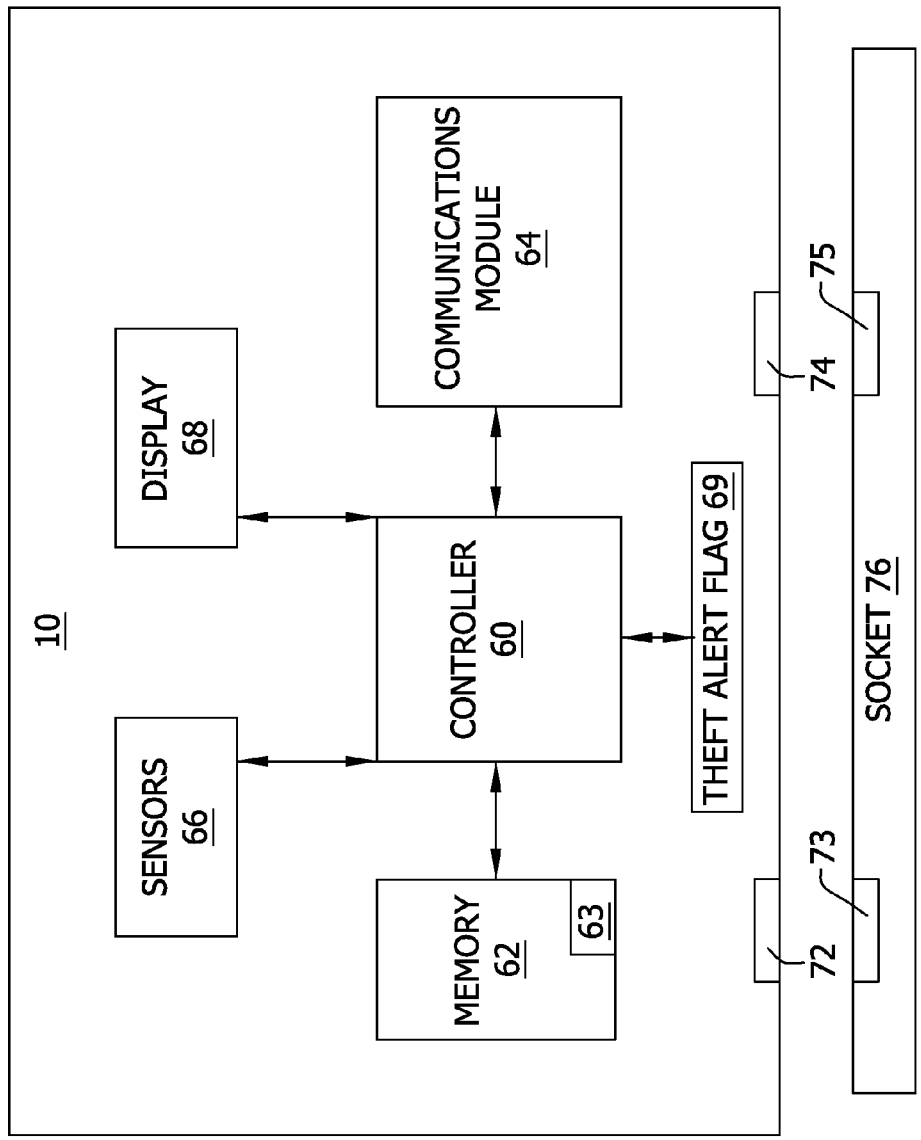
FIG. 2 is a schematic view of an exemplary electricity meter for use with the system shown in FIG. 1.

FIG. 2 illustrates an exemplary electricity meter 10 for use with system 9. In the exemplary embodiment, meter 10 is coupled to an alternating current (AC) power source provided by utility company 20. Specifically, meter 10 is coupled in communication with a socket 76 to enable a flow of electricity through at least one customer line 18 to be monitored. Meter 10 includes a line connection 72 and a load connection 74, and socket 76 includes a corresponding line connection 73 and a corresponding load connection 75. In the exemplary embodiment, line connections 72 and 73, and load connections 74 and 75, are fabricated as a single terminal. Alternatively, line connections 72 and 73, and/or load connections 74 and 75, may be formed as a plurality of terminals and/or wires. In operation, meter line connection 72 couples to socket line connection 73, and meter load connection 74 couples to socket load connection 75.

Meter 10 also includes a controller 60, a memory 62, a communications module 64, one or more sensors 66, and a display 68. In the exemplary embodiment, communications module 64 transmits signals to utility company 20 and/or receives signals (e.g., requests for data) from utility company 20. Alternatively, communications module 64 may communicate with automatic meter reading system 19 located remotely from meter 10, such as, for example, when automatic meter reading system 19 is selectively activated. In one embodiment, communications module 64 may include one or more optical ports for use in communicating with an external reader, a telephone modem, an RS-232 line, a simple input/output (I/O) board, a complex I/O board, and/or a plurality of wireless and/or cellular technologies.

Sensors 66 include current and/or voltage sensing devices that detect current and/or voltage flowing through meter 10 and/or power delivered to meter 10 for operation of meter 10. In the exemplary embodiment, sensors 66 include a single current sensing device. Alternatively, sensors 66 may include a plurality of current sensing devices and/or at least one metering chip, such as an AMD 7759 metering chip, that provides energy flow information to controller 60. Such energy flow information may include times energy was provided and/or quantities of energy consumption. In one embodiment, sensors 66 may include, and/or may be in communication with, analog-to-digital converters and/or digital signal processors.

Display 68 displays information associated with meter 10, including, but not limited to, electricity usage, demand data, and/or status alerts. Display 68 may utilize various display technologies, including, but not limited to, liquid crystal display (LCD), plasma, cathode ray tube (CRT), or analog-type display technologies.

Memory 62 may include any of a variety of known storage means, including, but not limited to, flash memory, electronically erasable programmable memory, read only memory (ROM), removable media, and/or other volatile and non-volatile storage devices. In the exemplary embodiment, executable instructions 63 (i.e., software instructions) are stored in memory 62 for use in detecting a potential electricity theft. Alternatively, executable instructions 63 may be stored remotely from memory 62 (e.g., at utility company 20 and/or in automatic meter reading system 19).

In one embodiment, meter 10 also includes a theft alert flag 69 and/or another indication of potential electricity theft. Theft alert flag 69 may be implemented in at least one additional hardware mechanism (i.e., a physical latch), in memory 62 and/or associated software, and/or on display 68. In another embodiment, meter 10 may include a back-up power source such as, for example, a battery.

Controller 60 may include any processor-based or microprocessor-based system, such as a computer system, that includes microcontrollers, reduced instruction set circuits (RISC), application-specific integrated circuits (ASICs), logic circuits, and any other circuit or processor that is capable of executing the functions described herein. As used herein, the term "processor" is not limited to only integrated circuits referred to in the art as a processor, but broadly refers to a computer, a microcontroller, a microcomputer, a programmable logic controller, an application specific integrated circuit and any other programmable circuit. Moreover, controller 60 may be a microprocessor that includes read-only memory (ROM) and/or random access memory (RAM), such as, for example, a 32 bit microcomputer with 2 Mbit ROM, and 64 Kbit RAM.

Controller 60 communicates (e.g., receives signals from and/or transmits signals to) sensors 66, memory 62, communications module 64, and/or a variety of other devices located within meter 10 and/or remotely from meter 10. In one embodiment, controller 60 may include and/or may communicate with a real-time clock that keeps time either synchronously or asynchronously with actual time, such as a discrete component time keeping device and/or time keeping software stored in a memory, such as, for example, memory 62.

Controller 60 executes instructions 63 to detect an operational scheme 100 of meter 10 that indicates a potential electricity theft, as described in detail below. In the exemplary embodiment, controller 60 and instructions 63 are housed within meter 10, such that controller 60 executes instructions 63 from within meter 10. In one embodiment, controller 60 may be housed within meter 10, and instructions 63 may be stored remotely from meter 10 in automatic meter reading system 19, such that controller 60 may selectively interface with automatic meter reading system 19 to execute instructions 63. In another embodiment, controller 60 and/or instructions 63 may be stored remotely from meter 10, such as, for example, at utility company 20 or within an enclosure positioned atop a utility pole. Alternatively, controller 60 and/or instructions 63 may be located anywhere that enables controller 60 to function as described herein.

In the exemplary embodiment, controller 60 communicates with sensors 66 and stores, in memory 62 and/or in a memory located remotely from meter 10, at least one operational record of meter 10. In one embodiment, controller 60 maintains a queue (e.g., a circular queue) of time-stamped operational records in memory 62 and/or in a memory located remotely from meter 10. In another embodiment, if controller detects a potential electricity theft after executing instructions 63, controller 60 stores a record of the detected potential electricity theft in memory 62 and/or in a memory located remotely from meter 10. Alternatively, controller 60 is located remotely from meter 10, and controller 60 requests and/or accesses at least one operational record from meter 10 (e.g., from within memory 62) and performs instructions 63 on the accessed record to determine whether a potential electricity theft occurred. In yet another embodiment, controller 60 may be housed remotely from meter 10 and may be in real-time communication with meter 10, such that controller 60 monitors at least one operation of meter and/or generates and stores, in memory 62 and/or in a memory located remotely from meter 10, a record of at least one operation of meter 10 and/or a record of at least one potential electricity theft at meter 10. As used herein, the term "real-time" refers to outcomes occurring a substantially short period after a change in the inputs affect the outcome, with no intentional delay. Optionally, meter 10 may automatically transmit a record indicative of either an operation of meter 10 and/or a potential electricity theft at meter 10 to a recipient device (e.g., controller 60) located remotely from meter 10 at an expiration of a predetermined time interval.

FIG. 3 is a flow diagram of an exemplary operational scheme 100 that is indicative of a potential electricity theft. Specifically, operational scheme 100 is indicative of either a delivered energy time and/or an accumulated energy being below an expected threshold.

During operational scheme 100, at least one sensor 66 detects load energy flowing through meter 10 and subsequently experiences a first power outage, such as, for example, when meter 10 is uncoupled from socket 76. When meter 10 experiences the first power outage, at least one sensor 66 detects 102 a loss of power and/or a subsequent switch from line power to battery power, and in response, transmits a signal to controller 60. Controller 60 stores a record of the event in memory 62 and/or in a memory located remotely from meter 10. During the power outage, meter 10 may be altered (i.e., inverted) from a first operational position to a second operational position by swapping line connections 72 and/or 73, and/or swapping load connections 74 and/or 75, between meter 10 and socket 76, by physically rotating meter 10 in socket 76, and/or by rewiring line connections 72 and/or 73, and/or by rewiring load connection 74 and/or 75 in either socket 76 and/or meter 10. In the second operational position, meter line connection 72 is coupled to socket load connection 75, and meter load connection 74 is coupled to socket line connection 73. If meter 10 is in an altered (i.e., inverted) position when recoupled to socket 76, sensor 66 detects 104 a restoration of power to meter 10, detects 106 either received energy or no load energy flowing through meter 10, and transmits a signal to controller 60. Controller 60 stores a record of the event in memory 62 and/or in a memory located remotely from meter 10. Meter 10 may subsequently be removed from socket 76, such that sensor 66 detects 108 a second power outage and transmits a signal to controller 60. Controller 60 stores a record of the event in memory 62 and/or in a memory located remotely from meter 10. If, after the second power outage, meter 10 is recoupled to socket 76 in an originally installed position (i.e., non-inverted) relative to socket 76, such that line connections 72 and 73 are coupled together and such that load connections 74 and 75 are coupled together, sensor 66 again detects 110 a restoration of power to meter 10, detects 112 load energy flowing through meter 10, and transmits a signal to controller 60. Controller 60 stores a record of the event in memory 62 and/or in a memory located remotely from meter 10. As used herein, the term "load energy" refers to energy being delivered to a device that is downstream from meter 10 and that draws electrical energy from a source through meter 10, and does not refer to energy flowing to meter 10 for consumption by meter 10. As used herein, the term "received energy" refers to energy flowing through meter 10 from a device that is downstream from meter 10, and does not refer to energy flowing to meter 10 for consumption by meter 10.

FIG. 4 is a flow chart of an exemplary operation 200 of controller 60 for use in detecting and reporting operational scheme 100. In the exemplary embodiment, controller 60 executes 202 instructions 63 stored in memory 62, and/or in a memory located remotely from meter 10, to determine 204 whether operational scheme 100 occurred. After determining 204 that operational scheme 100 occurred (i.e., that a potential theft was detected), theft alert flag 69, or another indication of theft, is activated 206 by controller 60 and is subsequently reported 208 to utility company 20 by controller 60 and/or communications module 64. Operation 200, or any individual step thereof, may be performed within meter 10, at utility company 20, and/or at any other remote location.

In the exemplary embodiment, theft alert flag 69 may be reported 208 in a variety of forms, such as, for example, by displaying an indication of a potential electricity theft on display 68 of meter 10. In another embodiment, theft alert flag 69 may be read locally and/or remotely through communications module 64 using standard reading protocols such as PSEM (Protocol Specification for Electric Metering). Alternatively, theft alert flag 69 may be read and/or broadcast by communications module 64 for automatic meter reading (e.g., Itron ERT utilized with automatic meter reading system 19). In other embodiments, theft alert flag 69 may be set in memory 62 and/or latched mechanically until cleared by utility company 20, thereby providing an indication that must be acknowledged by utility company 20. Alternatively, utility company 20 may have to break a meter seal and/or use a secure communication to clear theft alert flag 69. In another embodiment, instructions 63 may instruct controller 60 to increment or decrement a counter, stored in memory 62 and/or in a memory located remotely from meter 10, to maintain a count that is indicative of a number of theft alert flags 69 that were set during a given period of time.

In one embodiment, instructions 63 instruct controller 60 to recognize a predetermined parameter, such as a minimum time, kWh, and/or accumulated energy parameter, to minimize false theft alerts. Alternatively, instructions 63 may instruct controller 60 to monitor operations of meter 10 for a pre-determined period of time to determine if multiple instances of theft have occurred or that a theft pattern has occurred, thereby facilitating reducing false theft alerts. In another embodiment, false theft alerts may not be triggered by common electric distribution grid disturbances, such as when a reclosure switch clears a line fault and/or the power is temporarily or intermittently delivered.

As will be appreciated by one skilled in the art and based on the foregoing specification, the above-described embodiments of the invention may be implemented using computer programming or engineering techniques including computer software, firmware, hardware, or any combination or subset thereof, wherein one technical effect is to ensure that a potential electricity theft is detected and reported. Any resulting program, having computer-readable code means, may be embodied or provided within one or more computer-readable media, thereby making a computer program product, i.e., an article of manufacture, according to the discussed embodiments of the invention. The computer readable media may be, for example, but is not limited to, a fixed (hard) drive, diskette, optical disk, magnetic tape, semiconductor memory such as read-only memory (ROM), and/or any transmitting/receiving medium such as the Internet or other communication network or link. The article of manufacture containing the computer code may be made and/or used by executing the code directly from one medium, by copying the code from one medium to another medium, or by transmitting the code over a network.

Application programs that are components of the invention may include routines, programs, components, data structures, etc. that implements certain abstract data types, perform certain tasks, actions, or tasks. In a distributed computing environment, the application program (in whole or in part) may be located in local memory, or in other storage. In addition, or in the alternative, the application program (in whole or in part) may be located in remote memory or in storage to allow for the practice of the inventions where tasks are performed by remote processing devices linked through a communications network.

The method and system described herein facilitate detecting electricity theft and alerting a utility company when a potential electricity theft has been detected. As such, the method and system described herein facilitate minimizing instances of electricity theft and facilitate increasing revenues for utility companies by detecting and reporting a potential electricity theft to a utility company in a timely and reliable manner.

Exemplary embodiments of methods and systems for detecting electricity theft are described above in detail. The methods and systems for detecting electricity theft are not limited to the specific embodiments described herein, but rather, components of the methods and systems may be utilized independently and separately from other components described herein. For example, the methods and systems described herein may have other applications not limited to practice with residential electricity meters as described herein. Rather, the present invention can be implemented and utilized in connection with many other industries.

While the invention has been described in terms of various specific embodiments, those skilled in the art will recognize that the invention can be practiced with modification within the spirit and scope of the claims.

What is claimed is:

1. A method for detecting electricity theft in an electricity meter, said method comprising:

sensing a flow of load energy through the electricity meter when the meter is in a first meter position;
sensing a first power outage at the meter;
determining if no load energy is flowing through the meter after power has been restored to the meter after the first power outage and when the meter is in a second meter position that is electrically inverted with respect to the first meter position;
sensing a second power outage at the meter, wherein the second power outage occurs after the first power outage;
determining if load energy is flowing through the meter after power has been restored to the meter after the second power outage and when the meter is in the first meter position; and
outputting an indication of a potential electricity theft after determining that no load energy was flowing through the meter after the first power outage and after determining that load energy was flowing through the meter after the second power outage.

2. A method in accordance with claim 1, wherein said outputting an indication of a potential electricity theft comprises:
generating a record of an operational pattern of the meter; and
storing the record in a memory.

3. A method in accordance with claim 2, wherein at least one of said generating a record and said storing the record are performed remotely from the meter by a controller coupled in real-time communication with the meter.

4. A method in accordance with claim 2, wherein said generating a record comprises time-stamping the record.

5. A method in accordance with claim 2, wherein said generating a record and said storing the record are performed at the meter by a controller that is housed within the meter.

6. A method in accordance with claim 2, further comprising:
receiving at the meter a request to transmit the record to a controller located remotely from the meter; and
transmitting the requested record to the controller located remotely from the meter.

7. A method in accordance with claim 2, further comprising automatically transmitting the record to a controller located remotely from the meter after a predetermined time interval has elapsed.

8. An electricity meter comprising:
at least one sensing device for detecting at least one of a power outage at said meter and a flow of load energy through said meter, said at least one sensing device configured to sense a flow of load energy with said meter in a first position, and further configured to sense no flow of load energy with said meter in a second position, wherein in the second position said meter is electrically inverted with respect to the first position; and
a controller coupled to said at least one sensing device and configured to:
determine if no load energy flows through said meter after a first power outage at said meter;
determine if load energy flows through said meter after a second power outage that occurs after the first power outage; and
output an indication of a potential electricity theft after determining that no load energy was flowing through said meter after the first power outage and after determining that load energy was flowing through said meter after the second power outage.

9. An electricity meter in accordance with claim 8, further comprising a display for displaying an indication of a potential electricity theft.

10. An electricity meter in accordance with claim 8, wherein said at least one sensing device comprises at least one sensor for detecting a use of battery power by said meter.

11. An electricity meter in accordance with claim 8, wherein said controller is further configured to generate at least one time-stamped record of the potential electricity theft.

12. An electricity meter in accordance with claim 11, wherein said meter further comprises a memory, said controller is further configured to store said at least one time-stamped record of the potential electricity theft within said memory.

13. An electricity meter in accordance with claim 8, further comprising:
a memory for storing a record of at least one of an operational pattern of said meter and the indication of a potential electricity theft; and
a communications module configured to transmit the record to a controller located remotely from said meter.

14. A system for detecting electricity theft, said system comprising:
a plurality of customer lines for transferring electricity from a utility company;
at least one electricity meter coupled to each of said customer lines, wherein said at least one electricity meter comprises:
at least one sensing device for detecting at least one of a flow of load energy through said meter and a power outage at said meter, said at least one sensing device configured to sense a flow of load energy with said meter in a first position, and further configured to sense no flow of load energy with said meter in a second position, wherein in the second position said meter is electrically inverted with respect to the first position; and
a controller coupled to said at least one sensing device, said controller comprising executable instructions for:
determining if no load energy flows through said meter after a first power outage at said meter;
determining if load energy flows through said meter after a second power outage at said meter that occurs after the first power outage; and
outputting an indication of a potential electricity theft after determining that no load energy was flowing through said meter after the first power outage and after determining that load energy was flowing through said meter after the second power outage.

15. A system in accordance with claim 14, wherein said meter further comprises a memory, said controller is further configured to indicate the potential electricity theft by storing a theft alert flag in said memory.

16. A system in accordance with claim 14, wherein said meter further comprises a display for displaying an indication of a potential electricity theft.

17. A system in accordance with claim 14, wherein said meter further comprises a communications module configured to communicate with said utility company.

18. A system in accordance with claim 14, wherein said controller is located remotely from said meter, said controller configured to execute said executable instructions remotely from said meter.

19. A system in accordance with claim 14, wherein said controller is housed within said meter.

20. A system in accordance with claim 19, wherein said controller is further configured to:
  generate a record indicative of at least one of an operational pattern of said meter and the potential electricity theft;
  store the record in a memory housed within said meter; and
  transmit the record to said utility company upon receiving at said meter a request from said utility company.

* * * * *